United States Patent
Shih

(10) Patent No.: US 7,851,247 B2
(45) Date of Patent: Dec. 14, 2010

(54) METHOD OF FABRICATING MICRO-ELECTROMECHANICAL SYSTEM MICROPHONE STRUCTURE

(75) Inventor: Hui-Shen Shih, Chang-Hua Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 155 days.

(21) Appl. No.: 12/211,085

(22) Filed: Sep. 15, 2008

(65) Prior Publication Data

US 2010/0065931 A1    Mar. 18, 2010

(51) Int. Cl.
*H01L 21/00* (2006.01)
(52) U.S. Cl. .............. 438/53; 257/614; 257/E29.324; 381/335; 381/347; 381/355; 381/175; 381/375
(58) Field of Classification Search ............ 438/53; 257/614, E29.324; 381/335, 347, 355, 175, 381/375
See application file for complete search history.

(56) References Cited

U.S. PATENT DOCUMENTS

| | | | |
|---|---|---|---|
| 6,943,448 B2 | 9/2005 | Gabriel | |
| 7,081,647 B2 * | 7/2006 | Mushika | ............... 257/222 |
| 7,202,101 B2 | 4/2007 | Gabriel | |
| 2003/0210799 A1 * | 11/2003 | Gabriel et al. | ............... 381/173 |

* cited by examiner

*Primary Examiner*—Charles D Garber
*Assistant Examiner*—Yasser A Abdelaziez
(74) *Attorney, Agent, or Firm*—Winston Hsu; Scott Margo

(57) ABSTRACT

A method of fabricating a micro-electromechanical system microphone structure is disclosed. First, a substrate defining a MEMS region and a logic region is provided, and a surface of the substrate has a dielectric layer thereon. Next, at least one metal interconnect layer is formed on the dielectric layer in the logic region, and at least one micro-machined metal mesh is simultaneously formed in the dielectric layer of the MEMS region. Therefore, the thickness of the MEMS microphone structure can be effectively reduced.

5 Claims, 9 Drawing Sheets

METHOD OF FABRICATING MICRO-ELECTROMECHANICAL SYSTEM MICROPHONE STRUCTURE

BACKGROUND OF THE INVENTION

1. Field of the Invention

The present invention relates to a micro-electromechanical system (MEMS) microphone structure and a method of fabricating the same, and more particularly, to a method of fabricating a MEMS microphone structure and the MEMS microphone structure formed thereby so as to effectively reduce the thickness of the MEMS microphone structure.

2. Description of the Prior Art

MEMS microphone structures are modern technology, which coordinate electrical circuits and mechanics. The MEMS microphone structure presently can be made from general micro electronic technology, such as photolithography, vapor phase deposition, etching or LIGA, performed on the substrate, such as an insulating layer or other semiconductor. Recently, in order to coordinate the MEMS device and the complementary metal-oxide-semiconductor (CMOS) device into MEMS microphone structure, MEMS microphone structure is fabricated by using the same types of steps that are used to fabricate conventional analog and digital complementary metal oxide semiconductor (CMOS) circuits.

Referring to FIG. 1 through FIG. 3, FIG. 1 through FIG. 3 are schematic diagrams illustrating a method of fabricating a MEMS microphone structure according to the prior art. As shown in FIG. 1, the method of fabricating the MEMS microphone structure 10 with multi-metal layers according to the prior art is as follows. First, a substrate 12 is provided, and the surface of the substrate 12 has a base sacrificial layer 14 and a first metal layer 16. Then, the first metal layer 16 is patterned to form a first micro-machined metal mesh 18. Next, as shown in FIG. 2, a first sacrificial layer 20 is deposited to cover the substrate 12, and the surface of the first sacrificial layer 20 is planarized. Thereafter, a second metal layer 22 is formed on the first sacrificial layer 20, and then, a second metal layer 22 is patterned to form a second micro-machined metal mesh. Next, a second sacrificial layer 26 is deposited to cover the substrate 12, and the surface of the second sacrificial layer 26 is planarized. Then, a third metal layer 28 is formed on the second sacrificial layer 26, and then, the third metal layer 28 is patterned to form a third micro-machined metal mesh. Next, a third sacrificial layer 32 covers the substrate 12. Finally, as shown in FIG. 3, an isotropic dry etching process is utilized to remove the first sacrificial layer 20, the second sacrificial layer 26, the third sacrificial layer 32 and a part of the base sacrificial layer 14 among the first micro-machined metal mesh 18, second micro-machined metal mesh and third micro-machined metal mesh, so that the first micro-machined metal mesh 18, the second micro-machined metal mesh and the third micro-machined metal mesh are suspended above the substrate 12 so as to form a multilayer membrane. Next, a back side etching process is performed to etch through the substrate 12 so as to allow free movement of air molecules and vibrate the multilayer membrane. Therefore, the MEMS microphone structure 10 according to the prior art is formed.

As mentioned above, the micro-machined metal mesh according to the prior art is formed by using an Al process. The first metal layer, the second metal layer and the third metal layer composed of aluminum are respectively formed first, and then, a photoresist layer is coated thereon. Next, the photoresist layer is patterned, and then, the photoresist layer is used as a mask to etch the metal layers so as to form the micro-machined metal mesh. However, the height between the micro-machined metal mesh and the substrate depends on the thickness of the sacrificial layer, so that the thickness of the MEMS microphone structure is the total thickness of the sacrificial layers and the micro-machined metal meshes. The thickness of the MEMS device is limited. Therefore, in order to make the MEMS microphone structure have a smaller size or thickness, to improve the MEMS microphone structure and the method of fabricating the same is important.

SUMMARY OF THE INVENTION

It is therefore a primary objective of the present invention to provide a MEMS microphone structure and a method of fabricating the same, so that the thickness of the MEMS microphone structure can be effectively reduced.

The present invention provides a method of fabricating a MEMS microphone structure. First, a substrate is provided. The substrate defines a MEMS region and a logic region, and a surface of the substrate has a first dielectric layer and a first contact plug thereon. The first contact plug is located on the substrate in the logic region. Next, the first dielectric layer is etched to form at least one first meshed trench on the first dielectric layer in the MEMS region. Then, a metal layer is formed on the first dielectric layer and filled into the first meshed trench. Next, a patterned mask layer is formed on the metal layer in the logic region. Thereafter, a part of the metal layer uncovered with the patterned mask layer and outside the meshed trench is removed to simultaneously form at least one first metal interconnect layer on the first dielectric layer in the logic region and to form at least one first micro-machined metal mesh in the meshed trench of the MEMS region.

The present invention further provides a method of fabricating a MEMS microphone structure. First, a substrate is provided. The substrate defines a MEMS region and a logic region, and a surface of the substrate has a first dielectric layer thereon. Next, at least one circuit trench and at least one contact hole is formed in the first dielectric layer of the logic region. Then, at least one first meshed trench is formed in the first dielectric layer of the MEMS region. Then, a metal layer is formed on the first dielectric layer and filled into the circuit trench, the contact hole and the meshed trench. Finally, the metal layer outside the circuit trench, the contact hole and the meshed trench is removed to form a first metal interconnect structure in the circuit trench and the contact hole and to form a first micro-machined metal mesh in the meshed trench, wherein the first metal interconnect structure comprises at least one first lower contact plug and a first upper metal interconnect layer.

The present invention provides a MEMS microphone structure. The MEMS microphone structure comprises a substrate defining a logic region and a MEMS region, at least one dielectric layer disposed on the substrate of the logic region, at least one contact plug disposed in the dielectric layer of the logic region, at least one metal interconnect layer disposed on the dielectric layer, and at least one micro-machined metal mesh disposed on the dielectric layer in the MEMS region, and the height between an upper surface of the micro-machined metal mesh and the substrate and the height between a lower surface of the metal interconnect layer and the substrate being substantially the same.

The present invention further provides a MEMS microphone structure. The MEMS microphone structure comprises a substrate defining a logic region and a MEMS region, at least one dielectric layer disposed on the substrate of the logic region, at least one metal interconnect structure embedded in the dielectric layer, and at least one micro-machined metal mesh disposed in the MEMS region. The metal interconnect structure comprises at least one upper metal interconnect layer and at least one lower contact plug. The height between an upper surface of the micro-machined metal mesh and the substrate and the height between an upper surface of the upper metal interconnect layer and the substrate being substantially the same, and the height between a lower surface of the micro-machined metal mesh and the substrate and the height between a lower surface of the upper metal interconnect layer and the substrate being different.

The present invention utilizes a damascene process to form the micro-machined metal mesh in the MEMS region so as to reduce the thickness of the stacked micro-machined metal meshes, and reduce the thickness of the MEMS microphone structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
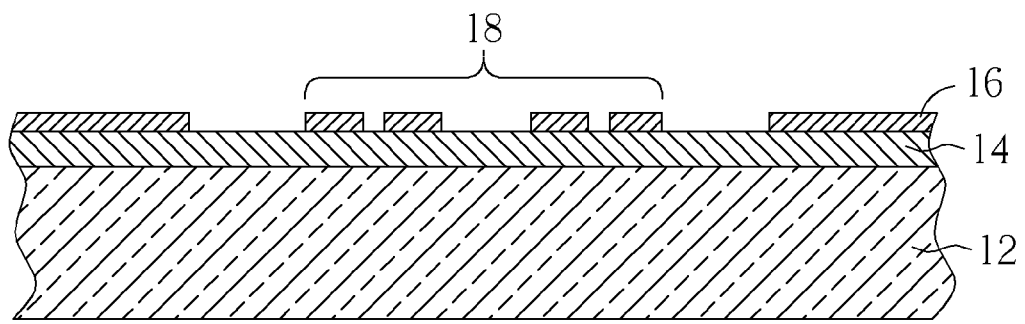
FIG. 1 through FIG. 3 are schematic diagrams illustrating a method of fabricating a MEMS microphone structure according to the prior art.
Figure 2:
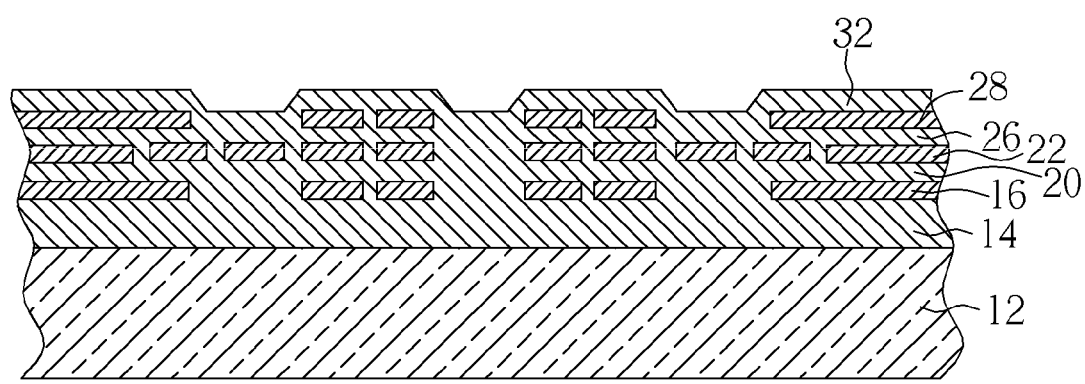
Figure 3:
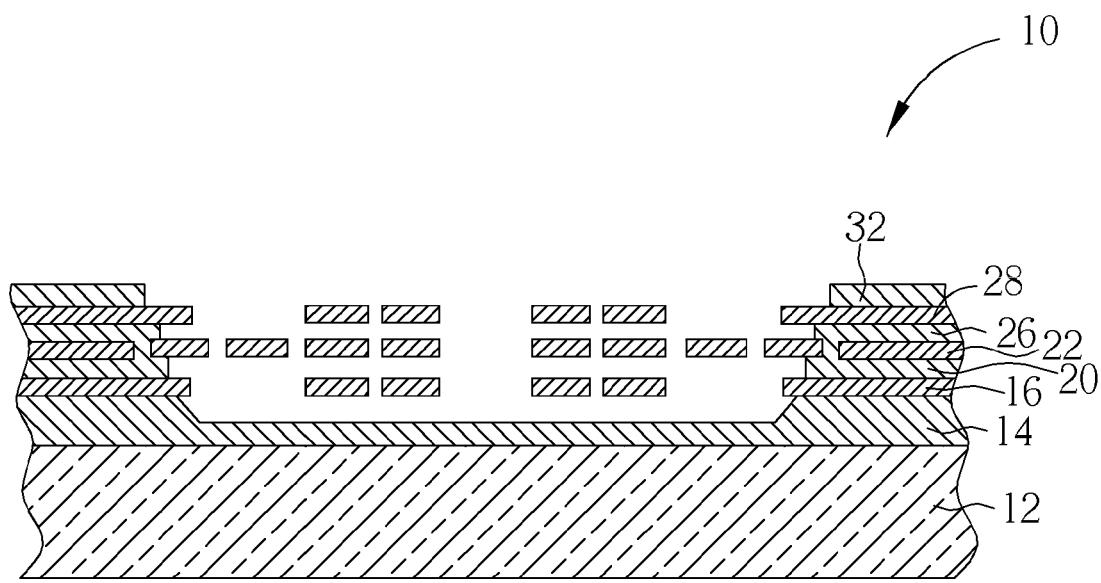
Figure 4:
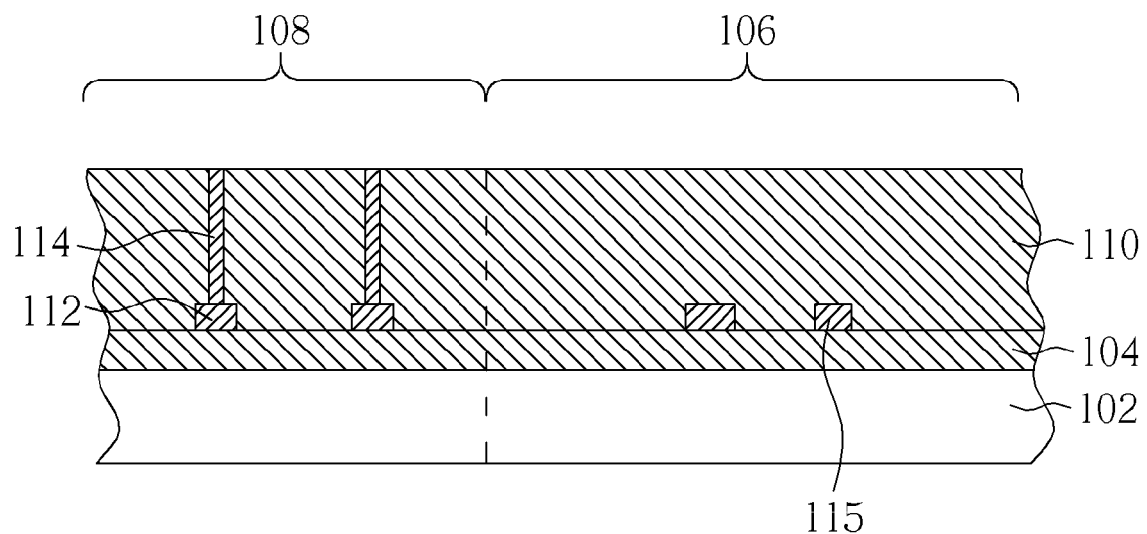
FIG. 4 through FIG. 10 are schematic diagrams illustrating a method of fabricating a MEMS microphone structure according to a first embodiment of the present invention.

Referring FIG. 4 through FIG. 10, FIG. 4 through FIG. 10 are schematic diagrams illustrating a method of fabricating a MEMS microphone structure according to a first embodiment of the present invention. As shown in FIG. 4, first, a substrate 102, such as semiconductor substrate etc., is provided. The substrate 102 defines a MEMS region 106 and a logic region 108, and a surface of the substrate 102 has a based dielectric layer 104, a based metal interconnect layer 112, a first dielectric layer 110 and at least one first contact plug thereon. In this embodiment, the based dielectric layer 104 is disposed on the substrate 102, and the based metal interconnect layer 112 is disposed on the substrate 102. The present invention is not limited to this condition, and the based metal interconnect layer can be embedded in the based dielectric layer. The first dielectric layer 110 covers the based metal interconnect layer 112, and the first contact plug 114 is disposed in the first dielectric layer 110 and passing through the first dielectric layer 110. The based dielectric layer 104 and the first dielectric layer 110 can be an Inter-Layer Dielectric (ILD) layer or any one of Inter-Metal Dielectric (IMD) layer of metal interconnect, and also can be single layer structure or multilayer structure. The material of the based dielectric layer 104 and the first dielectric layer 110 can comprise insulating material, such as silicon nitride and low-k.

In addition, the logic region 108 between the based dielectric layer 104 and the substrate 102 can further has at least one transistor (not shown in figure), which is used to be a circuit-controlled device of the MEMS microphone structure. The transistor can be electrically connected to the based metal interconnect layer 112 through at least one based contact plug (not shown in figure). The transistor can be P-type, N-type or Complementary type Metal Oxide Semiconductor (MOS). Furthermore, the first dielectric layer 110 further has at least one lower electrode layer 115 thereon, and the lower electrode layer 115 is located in the MEMS region 106. The material of the lower electrode layer 115 can be polysilicon or metal for being an electrode of MEMS microphone structure.

Figure 5:
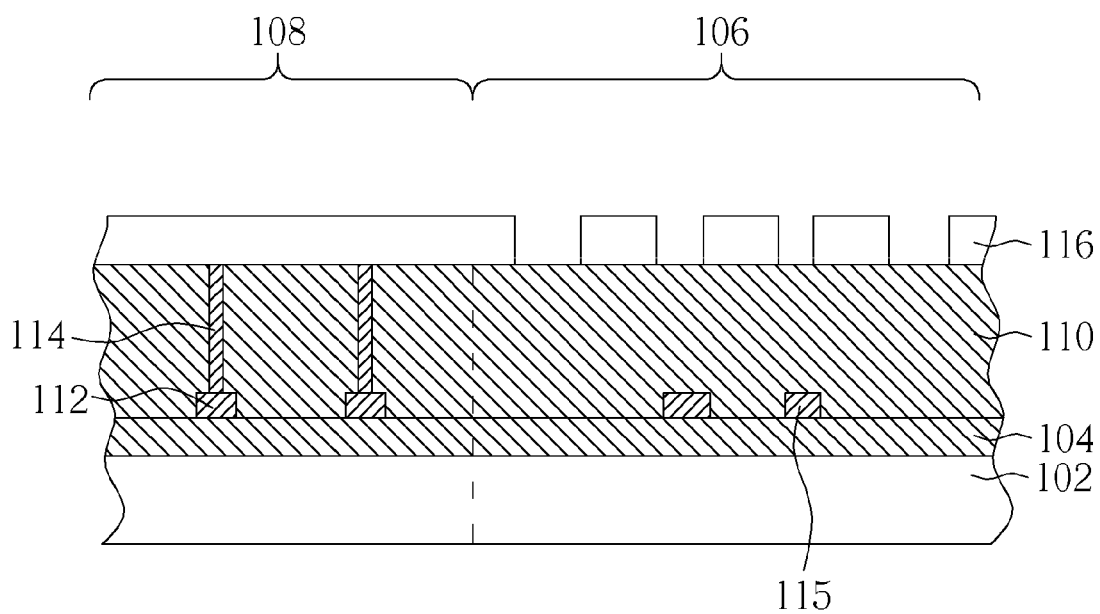

Next, as shown in FIG. 5, a first patterned mask layer 116, such as a photoresist layer, is formed on the first dielectric layer 110. The first patterned mask layer partially covers the first dielectric layer 110 in the MEMS region 106 and fully covers the first dielectric layer 110 in the logic region 108. The area of the first dielectric layer exposed by the first patterned mask layer 116 in the MEMS region 106 has a same pattern as a pattern of a first layer in a required MEMS microphone structure.

Figure 6:
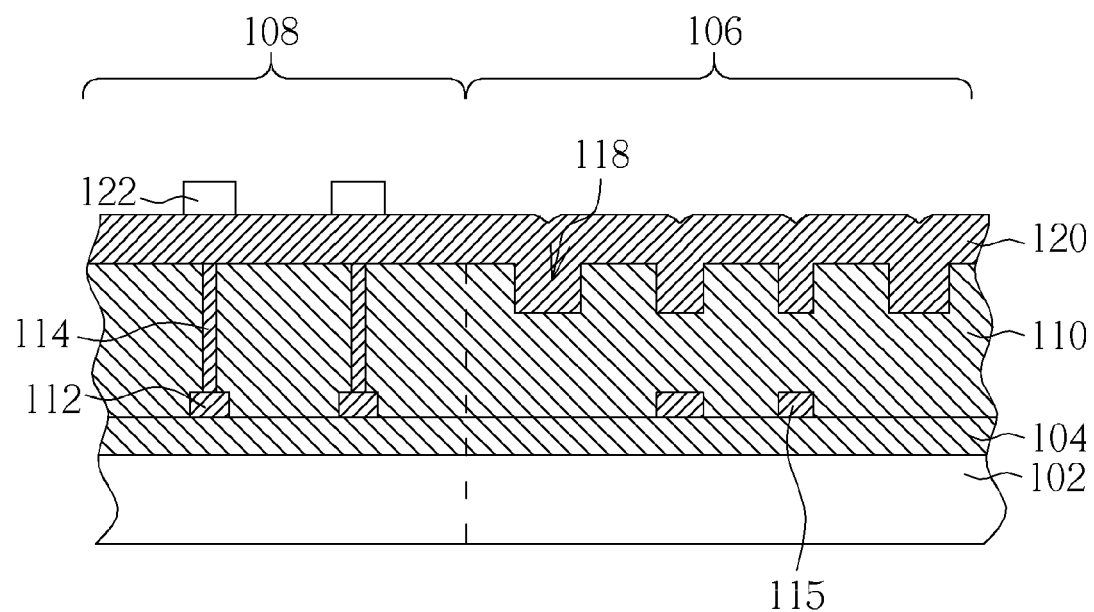

Then, as shown in FIG. 6, the first patterned mask layer 116 is used as a mask, and an etching process, such as an anisotropic deep reactive-ion etching (DRIE) process for dry-etching, is performed to etch the first dielectric layer 110 uncovered with the first patterned mask layer 116 so as to form at least one meshed trench 118 on the first dielectric layer 110 in the MEMS region 106. Then, the first patterned mask layer 116 used as the mask is removed. Next, a metal layer 120 is formed to cover the first dielectric layer 110 and fill the meshed trench 118 in the MEMS region 106. After that, a second patterned mask layer 122 is formed on the metal layer 120 in the logic region 108 so as to define the required pattern of a first layer of the metal interconnect structure in logic region 108. The second patterned mask layer 122 does not cover the metal layer 120 in the MEMS region 106.

Figure 7:
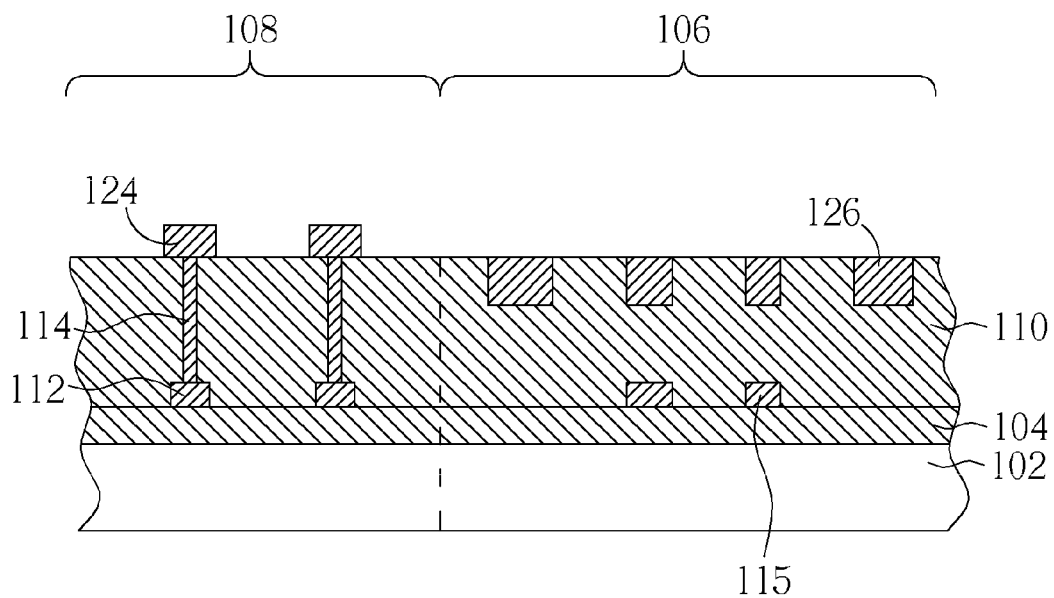

Next, as shown in FIG. 7, the second patterned mask layer 122 is used as a mask, and an etch back process is performed to remove a part of the metal layer uncovered with the second patterned mask layer 122 and outside the meshed trench 118. At least one first metal interconnect layer 124 is therefore formed on the first dielectric layer 110 in the logic region 108, and simultaneously, at least one first micro-machined metal mesh 126 is formed in the meshed trench 118 of the MEMS region 106. It should be noted the first metal interconnect layer 124 and the first micro-machined metal mesh 126 of this embodiment are composed of the same metal layer 120 and formed in a same etching process. Therefore, the steps for individually fabricating the circuit device in the logic region and the microphone structure in the MEMS region according to the prior art can be effectively reduced. In addition, the material of the metal layer 120 can include conductive metal, such as aluminum or polycide etc., or metallic compound. The present invention is not limited to these materials, and the material of the metal layer is chosen according to the material used for etching.

Figure 8:
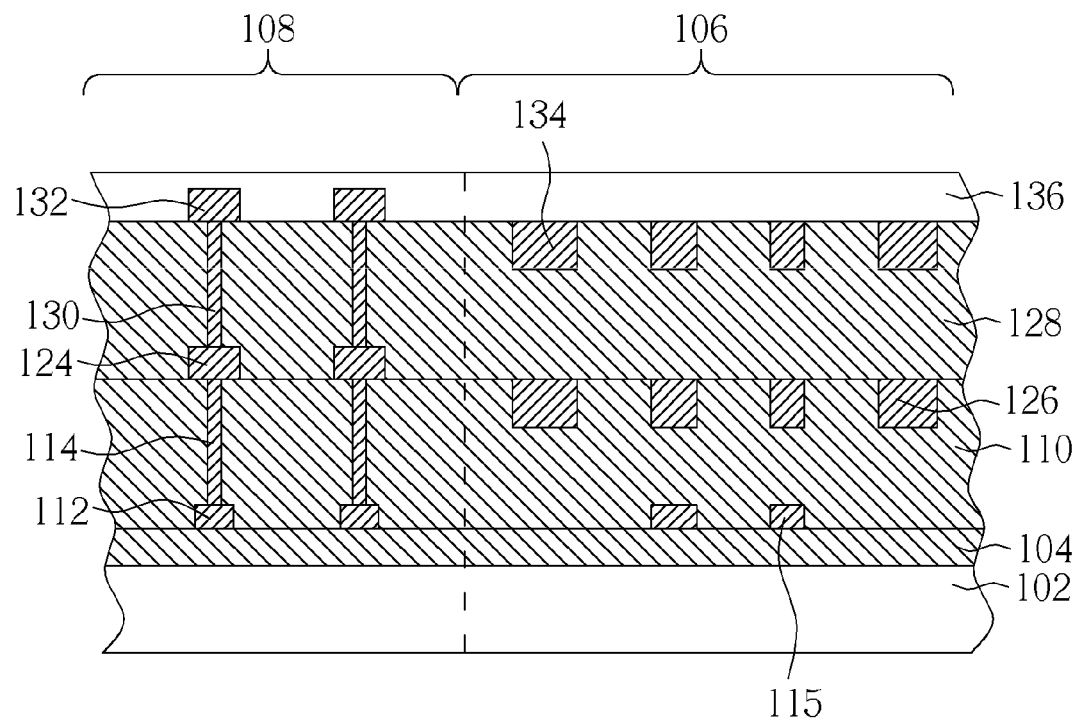

Next, as shown in FIG. 8, a second dielectric layer 128 is formed to cover the first metal interconnect layer 124, the first micro-machined metal mesh 126 and the first dielectric layer 110, and at least one second contact plug 130 is formed in the second dielectric layer 128 of the logic region 108. The second contact plug 130 is corresponding to the first metal interconnect layer 124 and passing through the second dielectric layer 128. Then, the step of forming the first metal interconnect layer 124 and the first micro-machined metal mesh 126 is repeated to form a second metal interconnect layer 132 on the second dielectric layer 128 in the logic region 108 and to form a second micro-machined metal mesh 134 in the second dielectric layer 128 of the MEMS region 106. Thereafter, a passivation layer 136 is formed to cover the second metal interconnect layer 132, the second micro-machined metal mesh 134 and the second dielectric layer 128. It should be noted that the present invention is not limited to fabricate only two metal interconnect layers or two micro-machined metal meshes. The present invention can only have one layer of the micro-machined metal mesh or the metal interconnect layer, and the numbers of the layers in the MEMS microphone structure can be chosen according to the design. After finishing fabricating the all metal interconnect layers and micro-machined metal meshes, the passivation layer 136 is then formed.

Figure 9:
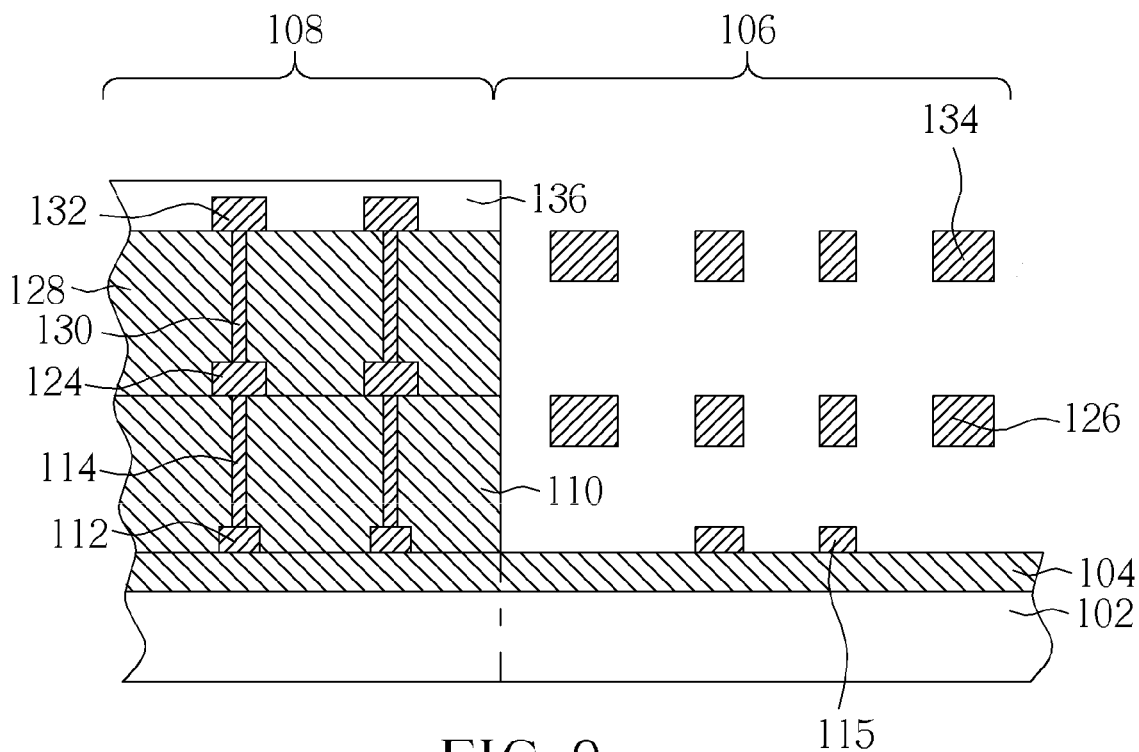

Finally, as shown in FIG. 9, after finishing all metal interconnect layer and the passivation layer 136, a patterned mask (not shown in figure) is used to cover and protect the logic region 108, and an etching process, such as an isotropic wet etching or vapor etching process, is performed to remove the first dielectric layer 110 surrounding the first micro-machined metal mesh 126 in the MEMS region 106 and the second dielectric layer 128 and the passivation layer 136 surrounding the second micro-machined metal mesh 134. Therefore, the first micro-machined metal mesh 126 and the second micro-machined metal mesh 134 are suspended to be membranes of the MEMS microphone structure. Then, the patterned mask is removed.

Figure 10:
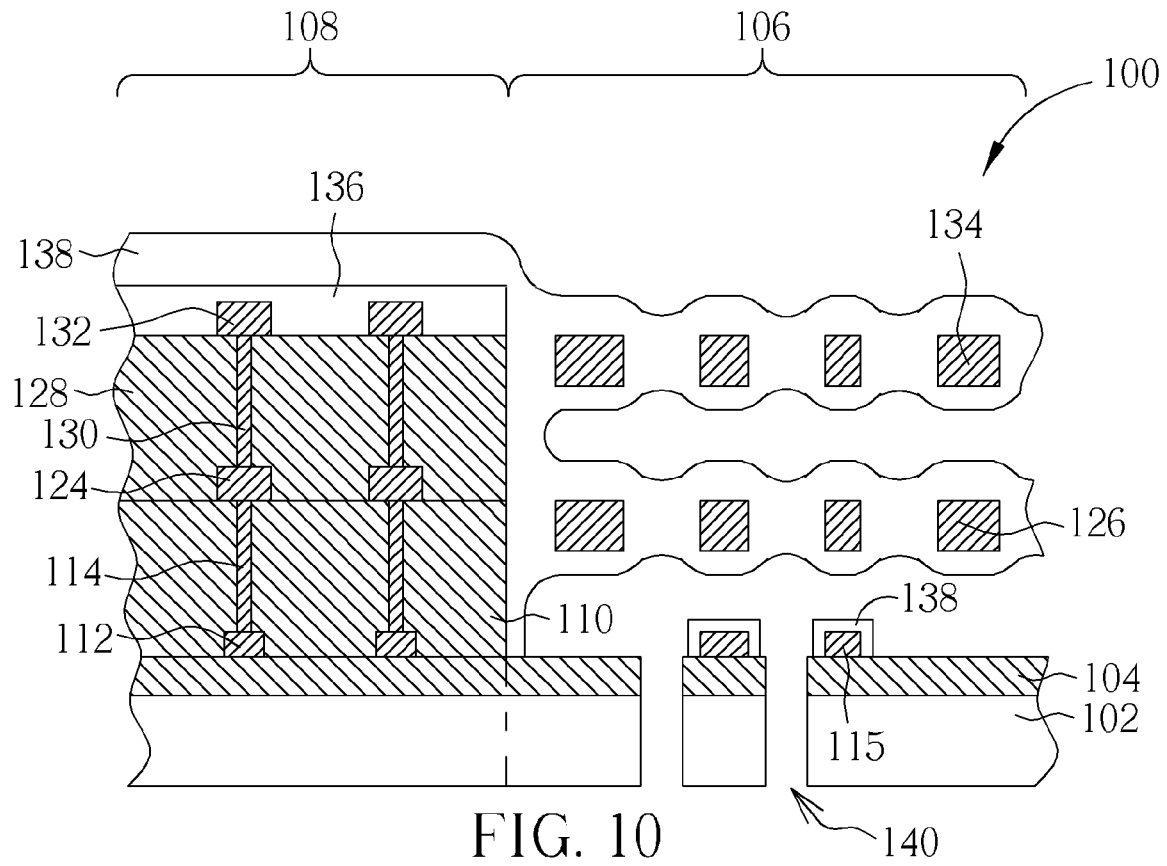

Thereafter, the formation of the MEMS microphone structure is continued. As shown in FIG. 10, an elastic layer 138 is applied conformally to allow the vibrated membrane to have a better elasticity. The elastic layer 138 may comprise for example plastic rubber, Teflon, Pyralene (Trade name, a chemical compound of polychlorinated biphenyls), or polyamide. Then, a back side etching process is performed to etch through the substrate 102 in the MEMS region 106 to form a vent hole 140 so as to allow free movement of air molecules. Therefore, the micro-machined metal meshes can vibrate due to the acoustic wave from the outside or transfer the acoustic wave to the outside through vibrating itself. And, a MEMS microphone structure 100 according to the first embodiment of the present invention is finished. Furthermore, in this embodiment, the micro-machined metal meshes of the MEMS microphone structure are preferred as a membrane with a mesh structure, but the present invention is not limited to this. The layout structure of the micro-machined metal mesh can be adjusted depending on the required function of the MEMS microphone structure. It should be noted that the first micro-machined metal mesh 126 and the second micro-machined metal mesh 134 of this embodiment is suspended in the MEMS region 106 and held by the first dielectric layer 110 in the logic region 108. In addition, the first micro-machined metal mesh 126 and the second micro-machined metal mesh 134 can respectively be further electrically connected to the first metal interconnect layer 124 and the second metal interconnect layer 132 in the logic region 108, so that the first micro-machined metal mesh 126 and the second micro-machined metal mesh 134 can have a characteristic of electrical transportation.

As mentioned above, in this embodiment, the first metal interconnect layer 124 in the logic region 108 is made from the Al process, and the first micro-machined metal mesh 126 in the MEMS region 106 is made from a damascene-like process at the same time. The height between the upper surface of the first micro-machined metal mesh 126 and the substrate 102 and the height between the lower surface of the first metal interconnect layer 124 and the substrate 102 are substantially the same, and the height between the upper surface of the second micro-machined metal mesh 134 and the substrate 102 and the height between the lower surface of the second metal interconnect layer 132 and the substrate 102 are substantially the same. Therefore, the first micro-machined metal mesh 126 is lower than the first metal interconnect layer 124, and the second micro-machined metal mesh 134 is lower than the second metal interconnect layer 132, so that the stacked thickness in the MEMS region 106 can be effectively reduced. In addition, in this embodiment, the first metal interconnect layer 124 and the first micro-machined metal mesh 126 are composed of a same metal layer and simultaneously formed in a same etching process, and the second metal interconnect layer 132 and the second micro-machined metal mesh 134 are composed of a same metal layer and simultaneously formed in a same etching process, so that the cost of the required fabricating steps in individually fabricating the MEMS region 106 and the logic region 108 can be effectively reduced.

In addition, as shown in FIG. 10, the present invention further provides a MEMS microphone structure 100 fabricated by the abovementioned first embodiment. The MEMS microphone structure 100 includes a substrate 102 defining a MEMS region 106 and a logic region 108, a based dielectric layer 104, a based metal interconnect layer 112, a first dielectric layer 110, at least one first contact plug 114, at least one first metal interconnect layer 124, and a first micro-machined metal mesh 126. The based dielectric layer 104 is disposed on the substrate 102, and the based metal interconnect layer 112 is disposed on the based dielectric layer 104. The first dielectric layer 110 partially covers the based dielectric layer 104 and the based metal interconnect layer 112, and the first metal interconnect layer 112 is disposed on the first dielectric layer 110. The first contact plug 114 is disposed in the first dielectric layer 110 and passing through the first dielectric layer 110, and the first contact plug 114 connects the first metal interconnect layer 124 and the based interconnect layer 112. The first micro-machined metal mesh 126 is held by the first dielectric layer 110 in the logic region 108 so as to be suspended in the MEMS region 106, and the first micro-machined metal mesh 126 can be electrically connected to the first metal interconnect layer 124. Therefore, control signals can be transported through the first metal interconnect layer 124 to the first micro-machined metal mesh 126, and be transported to the outside by vibrating the first micro-machined metal mesh 126. The height between an upper surface of the first micro-machined metal mesh 126 and the substrate 102 is substantially the same as or lower than the height between a lower surface of the first metal interconnect layer 124 and the substrate 102. In addition, this embodiment is not limited to only have one micro-machined metal mesh or one metal interconnect layer. The MEMS microphone structure 100 can further comprises at least one second dielectric layer 128 disposed on the first dielectric layer 110, at least one second metal interconnect layer 132 disposed on the second dielectric layer 128, at least one second contact plug 130 connecting the first metal interconnect layer 132 and the second metal interconnect layer 124, and at least one second micro-machined metal mesh 134 disposed in the MEMS region 106.

Figure 11:
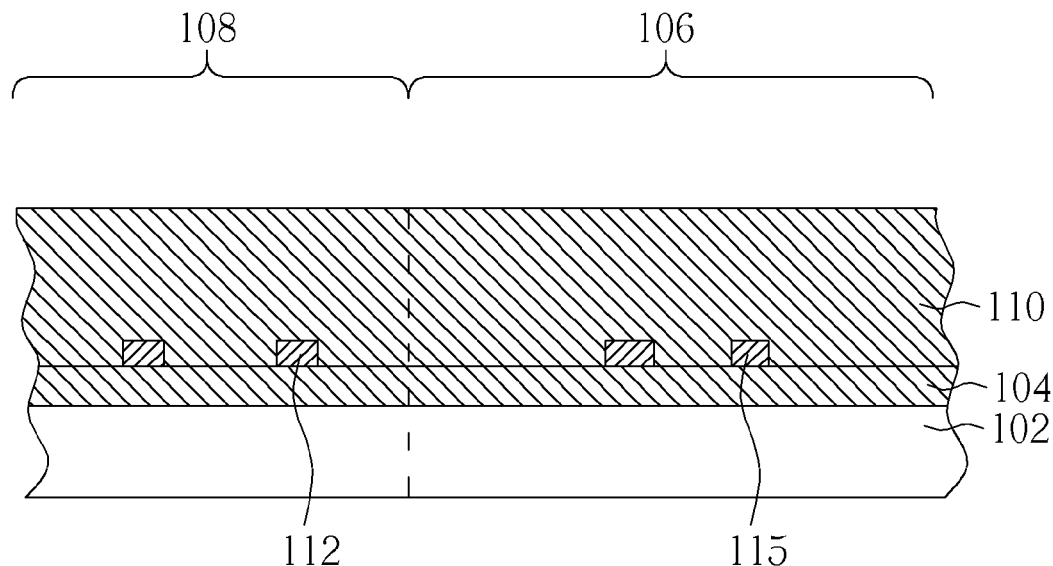
FIG. 11 through FIG. 15 are schematic diagrams illustrating a method of fabricating a MEMS microphone structure according to a second embodiment of the present invention.

It should be noted the present invention is not limited to the fabricating method according to the abovementioned embodiment, and the steps for fabricating the metal interconnect layer and the contact plug in the method of fabricating the MEMS microphone structure of the present invention also can be different. For convenience, like elements are denoted by like numerals, and the like steps are not detailed redundantly. Referring to FIG. 11 through FIG. 15, FIG. 11 through FIG. 15 are schematic diagrams illustrating a method of fabricating a MEMS microphone structure according to a second embodiment of the present invention. As shown in FIG. 11, compared with the first embodiment, this embodiment provides a substrate 102, which has a first dielectric layer 110 thereon, and there are no contact plug in the first dielectric layer 110 before forming the MEMS microphone structure of this embodiment.

Figure 12:
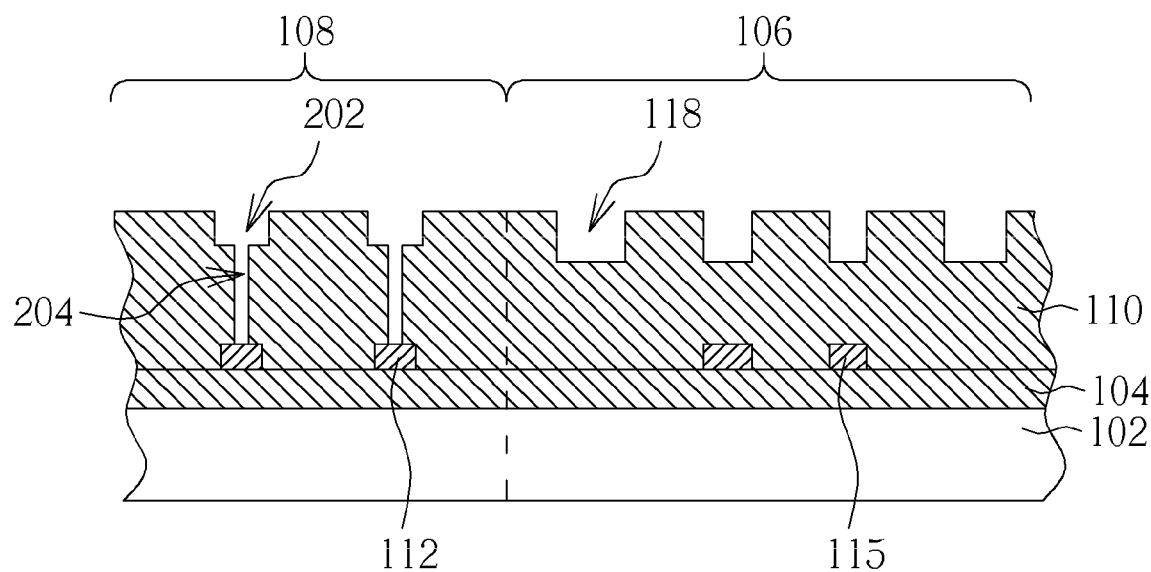

Thereafter, as shown in FIG. 12, different from the first embodiment, this embodiment performs a dual damascene process, such as a via-first dual damascene process, a trench-first dual damascene process, a partial via-first dual damascene process and etc., for the first dielectric layer 110 in the logic region 108 so as to form at least one circuit trench 202 and at least one contact hole 204 in the first dielectric layer 110 of the logic region 108 and form the meshed trench 118 in the first dielectric layer 110 of the MEMS region 106. It should be noted that the meshed trench 118 can be formed by two stage etching process in dual damascene process. For this reason, when the dual damascene process is via-first dual damascene process, the meshed trench 118 and the circuit trench 202 are formed in a same etching process. When the dual damascene process is trench-first dual damascene process, the meshed trench 118 and the contact hole 204 are formed in a same etching process. When the dual damascene process is partial via-first dual damascene process, the meshed trench 118, the contact hole 204 and the circuit trench 202 are formed in a same etching process. The present invention is not limited that the meshed trench 118 should be formed with the contact hole 204 and the circuit trench 202 in a same etching process, and the meshed trench 118 also can be formed before or after the dual damascene process.

Figure 13:
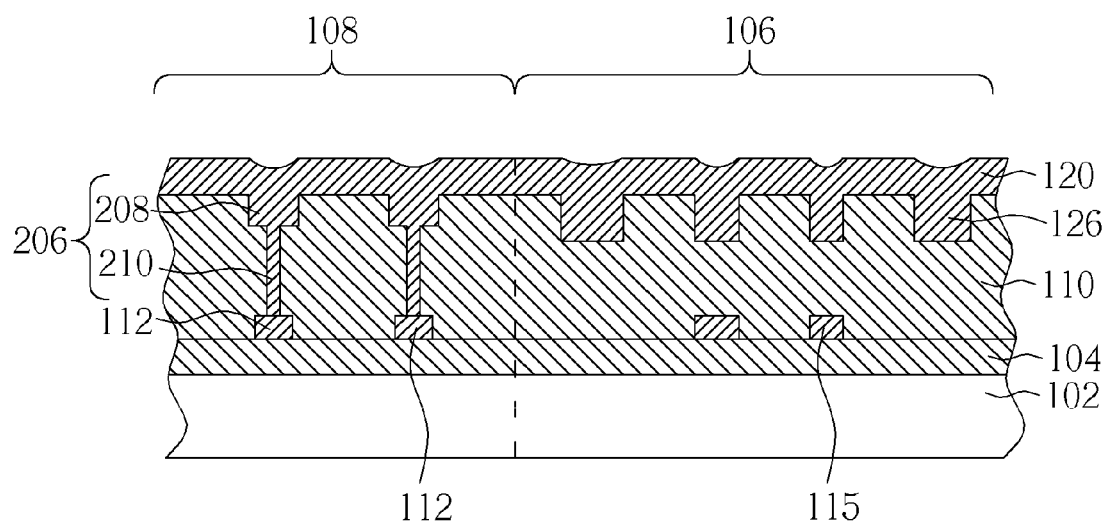

Then, as shown in FIG. 13, a metal layer 120 is formed on the substrate 102 to cover the first dielectric layer 110 and fill the circuit trench 202, the contact hole 204 and the meshed trench 118. Next, the metal layer 120 outside the circuit trench 202, the contact hole 204 and the meshed trench 118 is removed to form a first metal interconnect structure 206 in the circuit trench 202 and the contact hole 204 and form a first micro-machined metal mesh 126. Compared with the first embodiment, the first metal interconnect structure 206 includes at least one first upper metal interconnect layer 208 and at least one lower contact plug 210, which are composed of a same metal layer and formed in a same step. The first upper metal interconnect layer 208 and the first lower contact plug 210 construct a dual damascene structure, and the first micro-machined metal mesh 126 is a single damascene structure. In addition, the step for removing the metal layer 120 is a planarization process, which can includes a chemical mechanical polishing (CMP) process, an etching process or a combination thereof. The material constituting the metal layer 120 can include Cu, Al, alloy, polycide, W, Ti, TiN, Ta, TaN or a combination thereof, and the material of the metal layer 120 is mainly determined according to the method for removing the metal layer 120. The metal layers for filling the meshed trench 118, the circuit trench 202 and the contact hole 204 in the present invention also can be different metal layers. This means a metal layer can be filled into the meshed trench 118, and the other metal layer can be filled into the circuit trench 202 and the contact hole 204, so that the material of the first metal interconnect structure 206 can be different from the material of the first micro-machined metal mesh 126.

Figure 14:
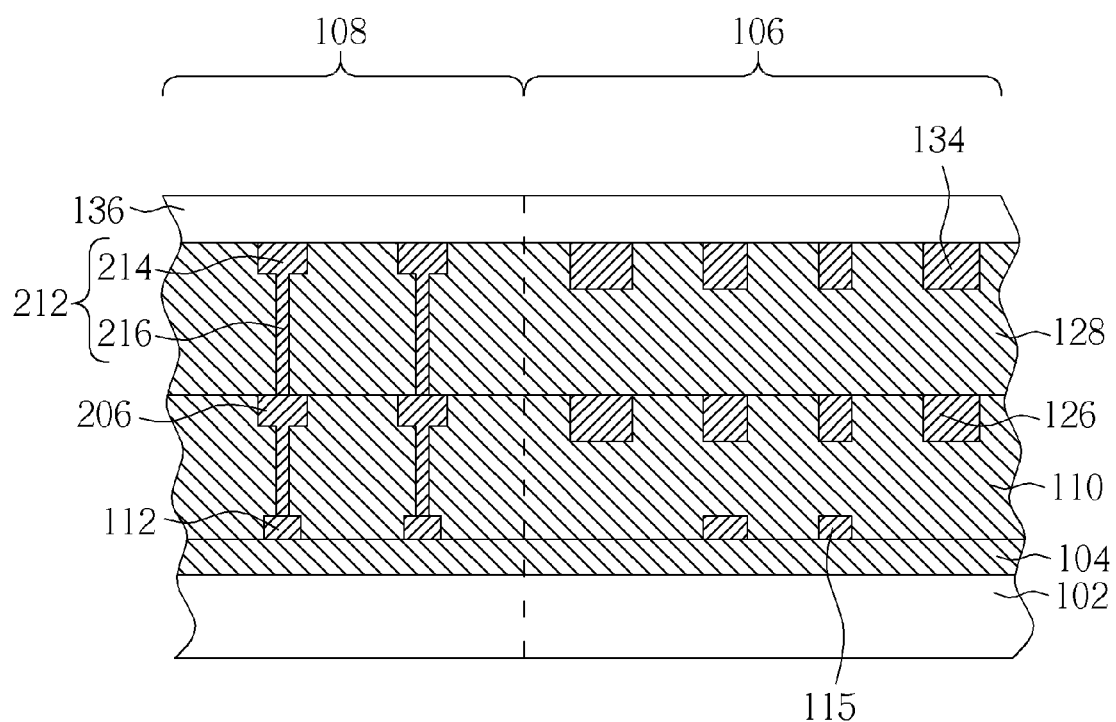

Next, as shown in FIG. 14, a second dielectric layer 128 is formed to cover the first metal interconnect structure 206, the first micro-machined metal mesh 126 and the first dielectric layer 110. Then, the step of this embodiment for forming the first metal interconnect structure 206 and the first micro-machined metal mesh 126 is repeated to form a second metal interconnect layer 212 embedded in the second dielectric layer 128 of the logic region 108 and to form a second micro-machined metal mesh 134 in the second dielectric layer 128 of the MEMS region 106. Thereafter, a passivation layer 136 is formed to cover the second metal interconnect structure 212, the second micro-machined metal mesh 134 and the second dielectric layer 128. It should be noted that the present invention is not limited to fabricate only two metal interconnect layers or two micro-machined metal meshes. The present invention can only have one layer of the micro-machined metal mesh or the metal interconnect layer, and the numbers of the layers in the MEMS microphone structure can be chosen according to the design. After finishing fabricating the all metal interconnect layers and micro-machined metal meshes, the passivation layer 136 is then formed.

Figure 15:
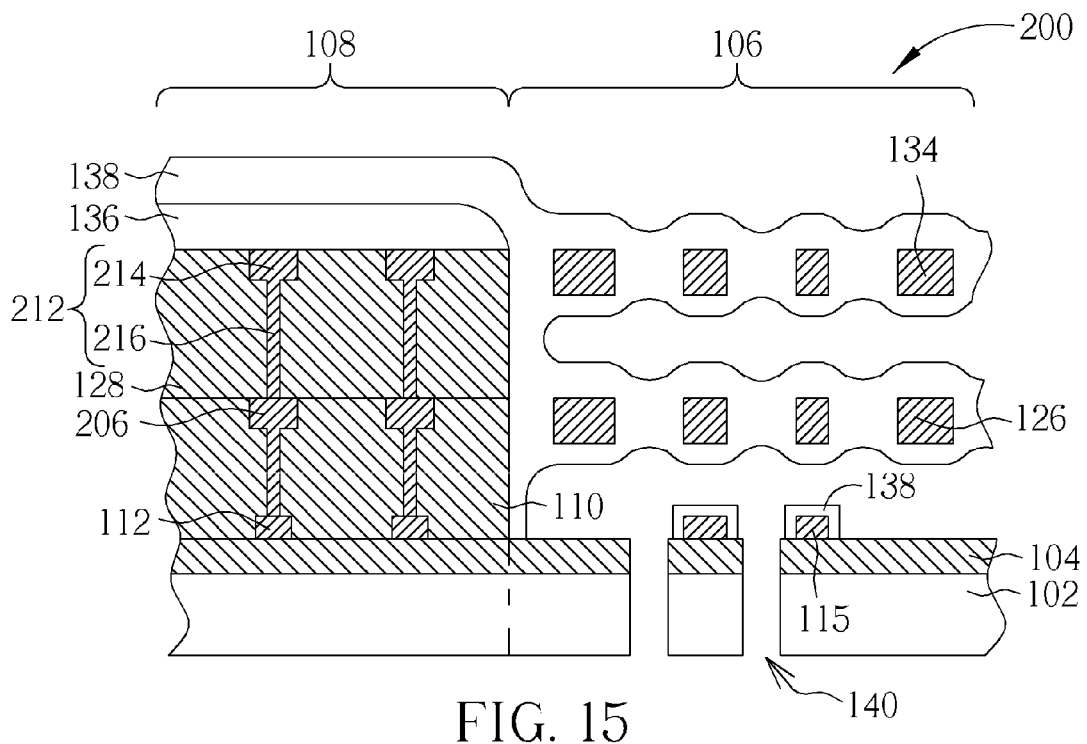

Then, as shown in FIG. 15, after finishing all metal interconnect layer and the passivation layer 136, the first dielectric layer 110 surrounding the first micro-machined metal mesh 126 in the MEMS region 106 and the second dielectric layer 128 and the passivation layer 136 surrounding the second micro-machined metal mesh 134 are removed. Therefore, the first micro-machined metal mesh 126 and the second micro-machined metal mesh 134 are suspended to be membranes of the MEMS microphone structure 200. Thereafter, the following processes of this embodiment are the same as the FIG. 10 of the first embodiment, and the following processes of this embodiment will not be detailed redundantly. It should be noted that the step for forming the meshed trench 118 and the step for forming the circuit trench 202 and the contact hole 204 are performed in a same dual damascene process, and the meshed trench 118, the circuit trench 202 and the contact hole 204 are filled with a same metal layer in the following process. Therefore, the cost of the required fabricating steps in individually fabricating the MEMS region 106 and the logic region 108 can be effectively reduced.

In addition, as shown in FIG. 15, the present invention further provides a MEMS microphone structure 200 fabricated by the abovementioned method according to the second embodiment. The MEMS microphone structure 200 includes a substrate 102 defining a MEMS region 106 and a logic region 108, a based dielectric layer 104, a based metal interconnect layer 112, a first dielectric layer 110, a first metal interconnect structure 206, and a first micro-machined metal mesh 126. The based dielectric layer 104 is disposed on the substrate 102, and the based metal interconnect layer 112 is disposed on the based dielectric layer 104. The first dielectric layer 110 partially covers the based dielectric layer 104 and the based metal interconnect layer 112, and the first metal interconnect structure 206 is embedded in the first dielectric layer 110. The first metal interconnect structure 206 includes at least one first upper metal interconnect layer 208 and at least one first lower contact plug 210, and the first lower contact plug 210 is electrically connected to the based metal interconnect layer 112 and the first upper metal interconnect layer 208. The first micro-machined metal mesh 126 is held by the first dielectric layer 110 so as to be suspended in the MEMS region 106. The differences of this embodiment from the MEMS microphone structure of the first embodiment are that the height between the upper surface of the first micro-machined metal mesh 126 and the substrate 102 is substantially the same as the height between the upper surface of the first metal interconnect structure 206 and the substrate 102, and the height between the lower surface of the first micro-machined metal mesh 126 and the substrate 102 is different from the height between the first lower contact hole 210 and the substrate 102. This also means the thicknesses of the first micro-machined metal mesh 126 and the first upper metal interconnect layer 208 are different. In addition, this embodiment is not limited to only have one micro-machined metal mesh or one metal interconnect structure. The MEMS microphone structure 200 can further comprises at least one second dielectric layer 128 disposed on the first dielectric layer 110, at least one second metal interconnect structure 212 disposed in the second dielectric layer 128 and at least one second micro-machined metal mesh 134 disposed in the MEMS region 106. The second metal interconnect structure 212 includes at least one second upper metal interconnect layer 214 and at least one lower contact plug 216.

Figure 16:
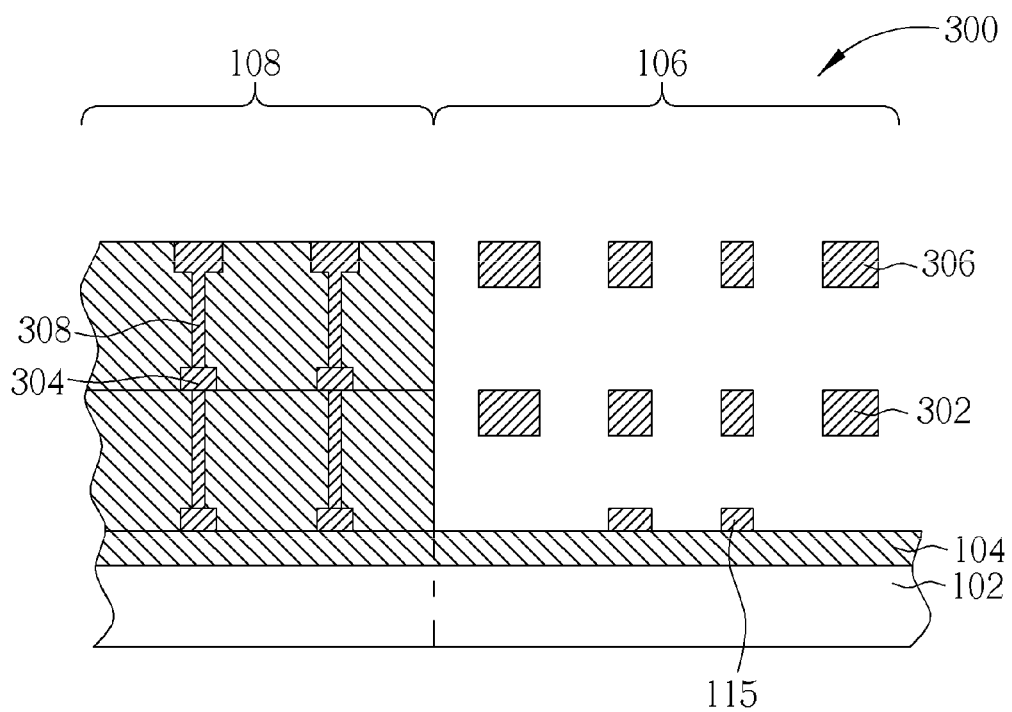
FIG. 16 and FIG. 17 are schematic diagrams illustrating cross-sections of MEMS microphone structures combining the first embodiment and the second embodiment of the present invention.
Figure 17:
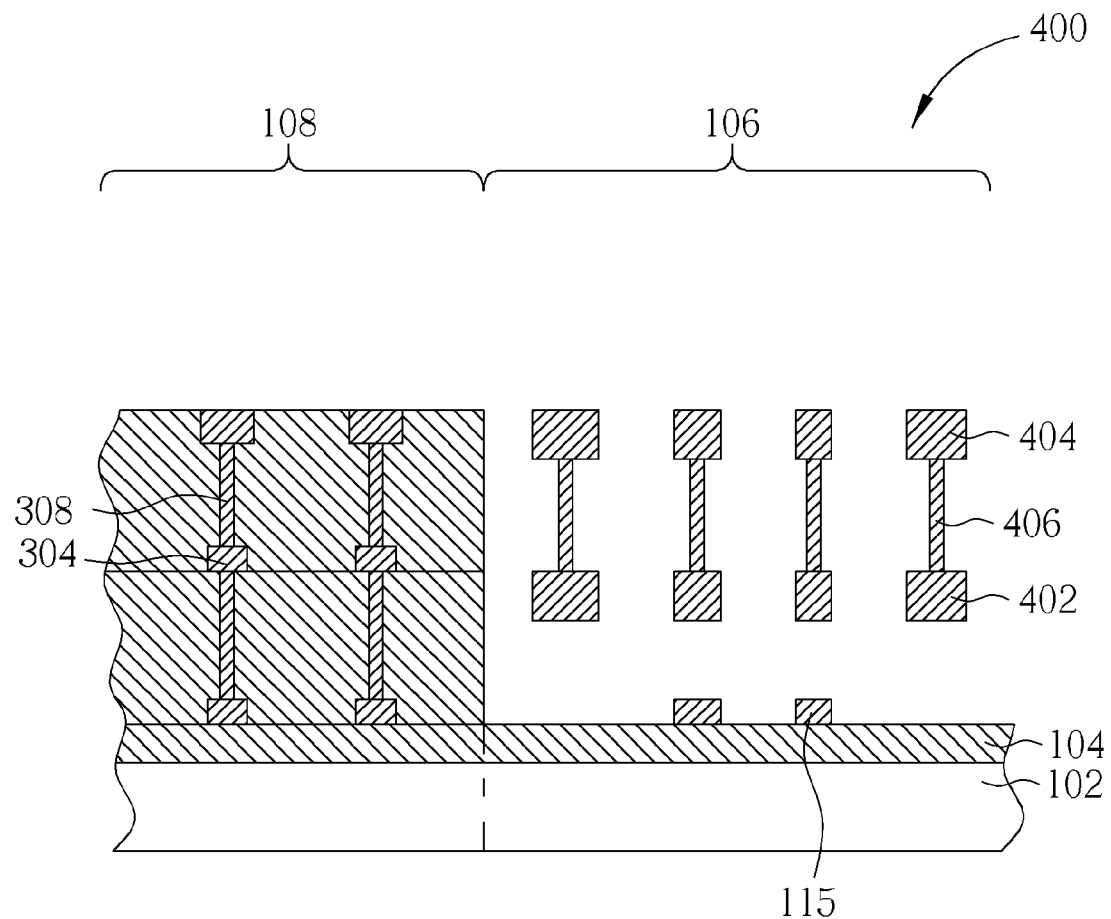

It should be noted that the present invention can further combine the methods of the first embodiment and the second embodiment to form the MEMS microphone structure including the first embodiment and the second embodiment. Referring to FIG. 16 and FIG. 17, FIG. 16 and FIG. 17 are schematic diagrams illustrating cross-sections of a MEMS microphone structure combining the first embodiment and the second embodiment of the present invention. As shown in FIG. 16, a MEMS microphone structure 300 can utilize the method of the first embodiment to form a first micro-machined metal mesh 302 and a first metal interconnect layer 304 on the first dielectric layer 110 in the logic region 108. Then, the method of the second embodiment can be utilized to form a second micro-machined metal mesh 306 on the first micro-machined metal mesh 302 and the first metal interconnect layer 304 and a second metal interconnect structure 308 disposed in the second dielectric layer 128. The present invention is not limited to the abovementioned combination of the first embodiment and the second embodiment, and the present invention can adjust the order and repeated time of the first embodiment and the second embodiment according to the requirements. In addition, as shown in FIG. 17, a method of fabricating a MEMS microphone structure 400 of the present invention also can selectively utilize a dual damascene process in the MEMS region 106 to form a plurality of contact plugs 406 between the first micro-machined metal mesh 402 and the second micro-machined metal mesh 404 so as to help the connections between the micro-machined metal meshes. The mechanical quality and the synchronous resonance of the micro-machined metal mesh are enhanced.

In summary, the present invention utilize the damascene-like process, the damascene process or the dual damascene process to form the micro-machined metal mesh in the MEMS region, and simultaneously, the present invention further integrates the Al process, the plug process or the dual damascene process to form the metal interconnect structure in the logic region so as to effectively reduce the thickness of the MEMS microphone structure and greatly simplify the process of the integrated MEMS microphone structure.

Those skilled in the art will readily observe that numerous modifications and alterations of the device and method may be made while retaining the teachings of the invention.

What is claimed is:

1. A method of fabricating a micro-electromechanical system (MEMS) microphone structure, comprising:
   providing a substrate, defining a MEMS region and a logic region, a surface of the substrate having a first dielectric layer and a first contact plug thereon, and the first contact plug located on the substrate in the logic region;
   etching the first dielectric layer to form at least one meshed trench on the first dielectric layer in the MEMS region;
   forming a metal layer on the first dielectric layer and filling the metal layer into the meshed trench;
   forming a patterned mask layer on the metal layer in the logic region; and
   removing a part of the metal layer uncovered with the patterned mask layer and outside the meshed trench, and removing the patterned mask layer so as to simultaneously form a first metal interconnect layer on the first dielectric layer in the logic region and to form a first micro-machined metal mesh in the meshed trench of the MEMS region.

2. The method of fabricating the MEMS microphone structure of claim 1, wherein the step of removing the part of the metal layer is performed by an etching process.

3. The method of fabricating the MEMS microphone structure of claim 1, further comprising removing the first dielectric layer in the MEMS region after forming the first metal interconnect layer and the first micro-machined metal mesh.

4. The method of fabricating the MEMS microphone structure of claim 1, further comprising:
   forming a second dielectric layer on the first metal interconnect layer, the first micro-machined metal mesh and the first dielectric layer after removing the part of the metal layer and the patterned mask layer;
   forming at least one second contact plug in the second dielectric layer of the logic region;
   forming at least one second metal interconnect layer on the second dielectric layer in the logic region, and forming at least one second micro-machined metal mesh in the second dielectric layer of the MEMS region; and
   removing the first dielectric layer and the second dielectric layer in the MEMS region.

5. The method of fabricating the MEMS device of claim 4, wherein the second contact plug is electrically connected to the second metal interconnect layer and the first metal interconnect layer.

* * * * *